United States Patent [19]

Sablev et al.

[11] Patent Number: 4,563,262
[45] Date of Patent: Jan. 7, 1986

[54] CONSUMABLE CATHODE FOR ELECTRIC-ARC METAL VAPORIZER

[76] Inventors: Leonid P. Sablev, P. Morozova, 3, kv. 3; Rimma I. Stupak, Valtera, 12, kv. 32, both of Kharkov, U.S.S.R.

[21] Appl. No.: 626,472
[22] PCT Filed: Feb. 23, 1982
[86] PCT No.: PCT/SU81/00014
§ 371 Date: Oct. 21, 1982
§ 102(e) Date: Oct. 21, 1982
[87] PCT Pub. No.: WO82/02906
PCT Pub. Date: Sep. 2, 1982

Related U.S. Application Data

[63] Continuation-in-part of Ser. No. 438,855, Oct. 21, 1982, abandoned.

[51] Int. Cl.⁴ .......................... C23C 14/26; B05D 3/06
[52] U.S. Cl. ................................ 204/298; 204/192 R; 204/192 C; 427/37
[58] Field of Search .............. 204/290 R, 298, 192 C, 204/192 SP; 219/192 R, 121 R; 427/37

[56] References Cited

U.S. PATENT DOCUMENTS

| | | | |
|---|---|---|---|
| 3,725,238 | 4/1973 | Fischbein et al. | 204/192 C |
| 3,836,451 | 9/1974 | Snaper | 204/298 |
| 3,854,984 | 12/1974 | Schadler et al. | 428/336 X |
| 3,974,058 | 8/1976 | Gokhale | 204/290 R |
| 3,985,635 | 10/1976 | Adam et al. | 204/192 C |
| 4,001,461 | 1/1977 | Bykhovski | 204/290 R |
| 4,380,493 | 4/1983 | Wortley et al. | 204/290 R |
| 4,417,968 | 11/1983 | McKelvey | 204/298 |
| 4,430,190 | 2/1984 | Eilers et al. | 204/192 R |
| 4,505,798 | 3/1985 | Ramachandran et al. | 204/192 R |

FOREIGN PATENT DOCUMENTS

| | | | |
|---|---|---|---|
| 0032370 | 2/1982 | Japan | 204/192 M |
| 1214851 | 12/1970 | United Kingdom | |

Primary Examiner—Andrew H. Metz
Assistant Examiner—Terryence Chapman
Attorney, Agent, or Firm—Fleit, Jacobson, Cohn & Price

[57] ABSTRACT

A consumable cathode used in electric-arc metal vaporizers to produce multi-component coatings on articles. The cathode has a unitary design, consisting of a plurality of layers of different metals, the number of the layers being determined by the number of coating components. The layers are arranged so that the value of the cathode potential drop of the metals decreases from the geometric axis of the consumable cathode to the periphery thereof in order to ensure a uniform vaporization of the cathode layers. The cathode spot is retained on the working end of the consumable cathode with the help of a solenoid-generated magnetic field.

6 Claims, 6 Drawing Figures

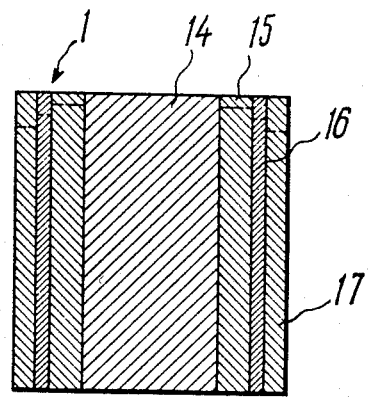
FIG.2
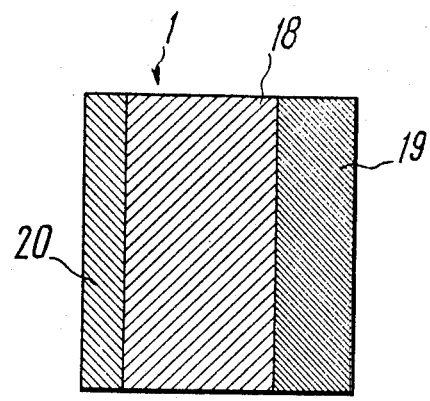
FIG.4
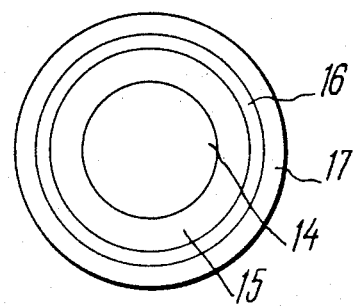
FIG.3
FIG.5
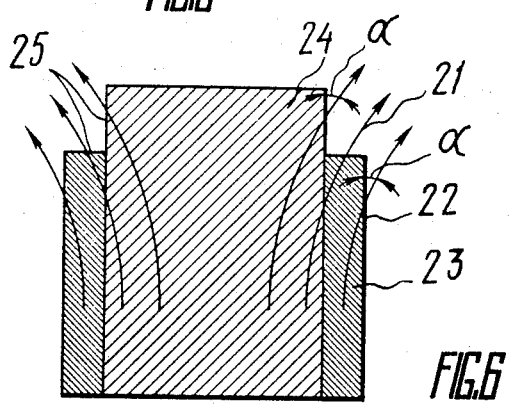
FIG.6

4,563,262

CONSUMABLE CATHODE FOR ELECTRIC-ARC METAL VAPORIZER

This application is a continuation-in-part of application Ser. No. 438,855, filed Oct. 21, 1982, now abandoned.

TECHNICAL FIELD

The invention relates to vacuum-arc plasma apparatus for producing multicomponent coatings and particularly to a consumable cathode for an electric-arc metal vaporizer of a vacuum-arc plasma apparatus.

BACKGROUND ART

To produce a multicomponent coating, several electric-arc vaporizers are installed in the prior art vacuum-devices, each of the vaporizers being provided with a consumable cathode made from one metal, or with an electric-arc vaporizer having several consumable cathodes from different metals. The number of cathodes in the electric-arc vaporizer corresponds to the number of components contained in the resulting multicomponent coating. Metals of the consumable cathodes have different values of a cathode drop of potential.

In the prior art vacuum-arc apparatus a uniform multicomponent coating is produced through an increase in the number of consumable cathodes made from different metals. Such an increase in the number of consumable cathodes results in complicating the design of the electric-arc metal vaporizer.

Known in the art is an electric-arc vaporizer (USSR Author's Certificate No. 426,540) for producing a multicomponent coating, comprising an anode, consumable cathodes, an igniting electrode, a magnetic system, and a substrate.

The consumable cathodes are made from different metals and are mounted along the circumference on the end portion of the body of the electric-arc vaporizer.

A cathode spot is produced on one of the consumable cathodes, which spot moves along the circumference by means of a magnetic field having an arched configuration, the consumable cathodes being disposed along said circumference. Metals of the consumable cathodes vaporize alternately, and the flow of metallic plasma is condensed on the substrate, thereby forming a multicomponent coating.

The resulting multicomponent coating does not possess a sufficient uniformity since in the electric-arc vaporizer there occurs successive vaporization of the consumable cathodes.

An electric-arc metal vaporizer disclosed in the USSR Author's Certificate No. 368,807 allows a uniform multicomponent coating to be produced, said vaporizer comprising an anode, a plurality of consumable cathodes, igniting electrodes, a magnetic system, and a substrate.

The consumable cathodes are disposed close to one another. Metals of the consumable cathodes have different values of the cathode drop of potential.

The number of the cathodes corresponds to the number of components of the resulting multicomponent coating. Each consumable cathode is provided with an igniting electrode and a power supply.

Using the igniting electrodes, the cathode spots are obtained simultaneously on the working end portions of the consumable cathodes. A uniform magnetic field allows coincidence of the flows of metallic plasma of maximum intensity from each of the consumable cathodes.

Metals of the consumable electrodes are simultaneously vaporized and condensed on the substrate, thereby forming a uniform multicomponent coating.

The above electric-arc vaporizer, however, has as many power supplies as the number of the consumable cathodes installed therein, which results in a considerable complication of its design.

DISCLOSURE OF THE INVENTION

The object of the invention is to provide a composite consumable cathode consisting of different metals, allowing a uniform multicomponent coating to be produced, and the design of an electric-arc metal vaporizer to be simplified.

The object set forth is attained in that a consumable cathode for an electric-arc metal vaporizer comprises layers of metals constituting a unitary cathode, the number of layers being equal to the number of the components of the coating on an article, the metals have different values of the cathode potential drop, and the layers are arranged in the order in which the value of the cathode potential drop of the metals decreases from the geometric axis of the consumable cathode toward the periphery thereof to maintain a uniform vaporization of the consumable cathode.

Such a consumable cathode produces a coating consisting of as many components as the number of metallic layers provided in the consumable cathode. The above consumable cathode is powered by one power supply and one igniting electrode.

BRIEF DESCRIPTION OF THE DRAWINGS

The idea of the invention is hereinafter illustrated by the description of a specific embodiment of the cathode with reference to the accompanying drawings, in which:

FIG. 2 shows an embodiment of the cathode in the form of a cylinder, longitudinal sectional view.

FIG. 3 shows the cathode of FIG. 2 viewed from the working end.

FIG. 4 is a longitudinal sectional view of a three-layer cathode in the form of a rectangular parallelepiped.

FIG. 5 shows the cathode of FIG. 4 viewed from the working end.

FIG. 6 is a diagram illustrating the operation of a consumable cathode for an electric-arc metal vaporizer.

BEST MODE OF CARRYING OUT THE INVENTION

Figure 1:
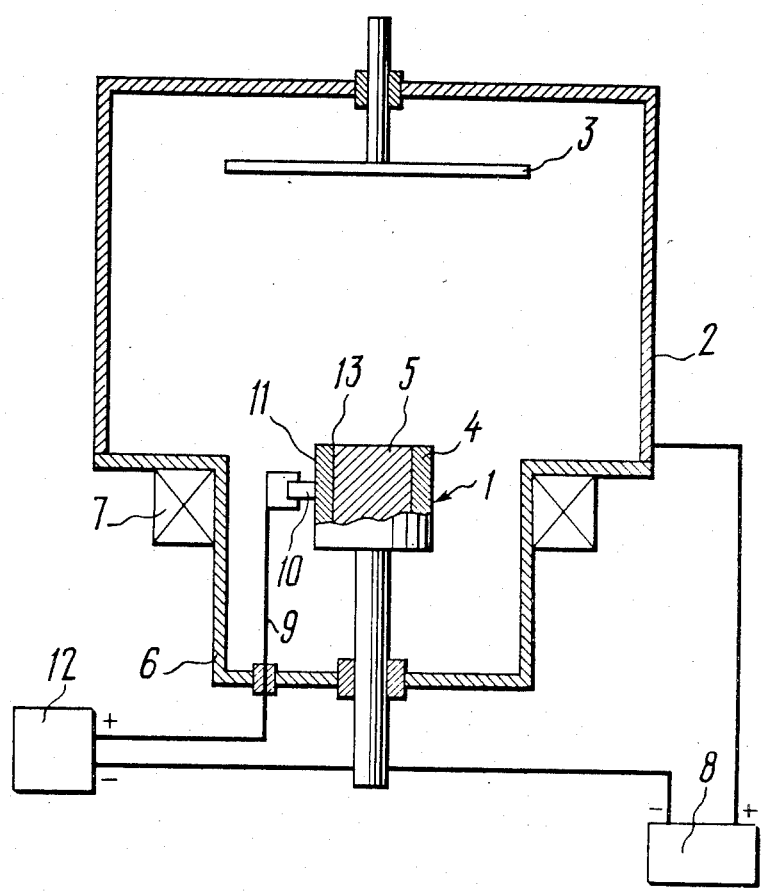
FIG. 1 is a general, longitudinal sectional diagrammatic view of a consumable cathode according to the invention.

An electric-arc metal vaporizer comprises a consumable cathode 1 of cylindrical shape mounted within a vacuum chamber 2, which serves as an anode, and a substrate 3 to which a multicomponent coating is to be applied.

The consumable cathode 1 consists of two metallic portions 4 and 5 defining a unitary cathode, each portion having a different value of the cathode drop of potential.

The metallic portions 4 and 5 are tightly connected by press fitting and disposed in the order of diminution of the values of the cathode drop of potential of the metals from the geometric axis of the consumable cathode 1 to the periphery thereof.

The consumable cathode 1 is mounted within a body 6 made from a nonmagnetic metal. On the body 6 a solenoid 7 is mounted producing an axially symmetric magnetic field diverging from the axis of the solenoid.

The consumable cathode 1 and the vacuum chamber 2 are connected to a DC power supply 8.

To ignite an arc discharge, there is provided in the electric-arc vaporizer an igniting electrode 9 mounted on a ceramic jumper 10 at a side surface 11 of the consumable cathode 1.

The igniting electrode 9 and the consumable cathode 1 are connected to a high-voltage pulse source 12 to generate a pulse discharge between the igniting electrode 9 and the consumable cathode 1.

Reference numeral 13 designates the working end portion of the consumable cathode 1.

The operation of the above-described composite cathode was tested according to the following examples:

EXAMPLE 1

A two-layer cathode of cylindrical shape was used, in which the inner core layer 5 (FIG. 1) was made of Nb, and the outer layer 4, of Ti. The cathode potential drop in a burning arc was 28 V for Nb, and 20.5 V for Ti.

EXAMPLE 2

A four-layer cathode of cylindrical shape was used, in which the inner layer 14 (FIGS. 2 and 3) was made of Zr, a successive layer 15, of Ti, a third layer 16, of Cr, and the outer layer 17, of Al. The cathode potential drop in a burning arc was 26 V for Zr, 20.5 V for Ti, 20.2 V for Cr, and 20 V for Al.

EXAMPLE 3

A three-layer cathode in the form of a rectangular parallelepiped was used, in which the inner core layer 18 (FIGS. 4 and 5) was made of Zr, one of the outer layers 19, of Ti, and the other layer 20, of Cr. The cathode potential drops in a burning arc for these elements are given above.

As is clear from the above example, the component parts of the cathode were arranged relative to the geometric axis of the unitary cathode in the order in which the cathode potential drop in a burning arc decreases.

The electric-arc metal vaporizer provided with the above-described consumable cathode (FIG. 1) operates as follows:

The d.c. power supply 8 is energized to produce an arc discharge. The solenoid 7 generates an axially symmetric magnetic field, the lines of force 21 (FIG. 6) of which define an acute angle with the side surface 22 of the cathode.

In the starting position of the cathode, the working end thereof (FIG. 1) has a flat shape. The cathode spot of the arc tends to move over the metal having a smaller cathode potential drop of the burning arc, that is, over the peripheral layer 4 of the cathode (FIG. 1). Therefore, the outer layer 23 of the cathode (FIG. 6) is consumed first, while the inner layer 24 (FIG. 6) is not consumed. As a result, a step 25 (FIG. 6) is formed on the working end of the cathode.

When the step is formed, the following two opposite factors influence the cathode spot:

(1) The cathode spot tends to exist on the metal having a smaller cathode potential drop, and (2) The cathode spot tends to shift to the inner layers of the cathode end under the effect of the magnetic field, the lines of force of which define an acute angle with the side surface of the step.

Under the force of the second factor, the cathode spot is pushed out to the inner layer 24 (FIG. 6).

For a definite height of the step 25 (which depends on the kind of the joined metal and the value of the magnetic field), the two factors are identical and, consequently, the position of the cathode spot on both parts is balanced, i.e., the height of the step does not vary any more with vaporization.

Given the constant shape of the cathode during the arc discharge the percentage-wise proportion of the components in the coating is determined by the thicknesses of the metal layers of the consumable cathode only.

The present invention, therefore, makes it possible to produce a uniform multicomponent coating on an article, with the consumable cathode being operated from a single power supply and one ignition system, as a result of which the electric-arc vaporizer has a relatively simple design.

The electric-arc metal vaporizer provided with the above described consumable cathode is started as follows.

The DC power supply 8 is energized to produce an arc discharge.

The solenoid 7 generates a magnetic field retaining a cathode spot on the working end portion 13 of the consumable cathode 1.

Using the high-voltage pulse source 12, a pulse discharge is generated between the igniting electrode 9 and the side surface 11 of the consumable cathode 1, and a cathode spot is produced on the side surface of the cathode.

The cathode spot drifts under the action of the force lines of the magnetic fied whose force lines form an acute angle with the side surface 11 of the consumable cathode 1, and goes out onto the working end portion 13 of the consumable cathode 1. The cathode spot is shifted over the working end portion 13 of the composite consumable cathode 1 under the influence of the magnitude of the cathode drop of potential of the metallic layer 4 and of the acute angle formed between the magnetic force lines of the surface of the consumable cathode 1. The time the cathode spot is located on each of the metallic layers 4 and 5 is the same and depends upon the magnitude and configuration of the magnetic field.

As a result of vaporization of the composite consumable cathode 1, a two-component uniform coating is formed.

The percentage of the components of the coating depends on the thickness of the metallic layers 4 and 5.

We claim:

1. (Four times amended) In an electric-arc metal vaporizer, the improvement comprising utilizing a consumable cathode having layers of separate metals to be electrically vaporized and constituting a unitary consumable cathode, the metals and the number of the layers of metals constituting the consumable cathode being equal to the metals and the number of metals constituting the components of a coating on an article, the metal layers of said consumable cathode being disposed in the order in which the value of the cathode drop of potential of the metals decreases from the geometric axis of the consumable cathode to the periphery thereof to maintain a uniform vaporization of the consumable cathode.

2. The consumable cathode according to claim 1 wherein said cathode is of cylindrical shape and comprises an inner cylindrical core layer of a single metal and at least one successive concentric outer layer, the outer layers each being of a single metal, the relative thicknesses of each of the metals of the consumable cathode being equal to the relative proportions of each of the metals of a multi-component metallic coating to be applied on the article to be coated.

3. The consumable cathode according to claim 2 wherein said cathode comprises a two-layer cathode including an inner core layer of niobium and an outer layer of titanium.

4. The consumable cathode according to claim 2 wherein said cathode comprises a four-layer cathode including a first inner core layer of zirconium, a second layer of titanium surrounding said zirconium core layer, a third layer of chromium surrounding said titanium layer, and a fourth, outer layer of aluminum surrounding said chromium layer.

5. The consumable cathode according to claim 1 wherein said cathode is in the form of a rectangular parallelepiped comprising an inner core layer of rectangular cross section and formed from a first metal, a second layer of rectangular cross section abutting and coextensive with one side of said core layer and formed from a second metal, and a third layer of rectangular cross section abutting and coextensive with the opposite side of said core layer and formed from a third metal, the relative thicknesses of each of the metals of the consumable cathode being equal to the relative proportions of each of the metals of a multi-component metallic coating to be applied on the article to be coated.

6. The consumable cathode according to claim 5 wherein said inner core layer is zirconium, said second layer is titanium, and said third layer is chromium.

* * * * *